(12) United States Patent
Goto et al.

(10) Patent No.: US 6,802,048 B2
(45) Date of Patent: Oct. 5, 2004

(54) DESIGN SUPPORT APPARATUS AND METHOD FOR DESIGNING SEMICONDUCTOR PACKAGES

(75) Inventors: Akihiro Goto, Tokyo (JP); Takao Takahashi, Hyogo (JP); Yoshio Matsuda, Hyogo (JP); Takashi Arita, Hyogo (JP); Koji Bando, Tokyo (JP); Akinobu Kawazu, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/263,090

(22) Filed: Oct. 3, 2002

(65) Prior Publication Data

US 2003/0192019 A1 Oct. 9, 2003

(30) Foreign Application Priority Data

Apr. 4, 2002 (JP) ........................................ 2002-102231

(51) Int. Cl.[7] ............................ G06F 17/50; G06F 9/45; G06F 9/455
(52) U.S. Cl. ................................ 716/5; 716/10; 716/11
(58) Field of Search ............................. 716/5, 1, 10, 11, 716/4

(56) References Cited

U.S. PATENT DOCUMENTS 5,479,603 A * 12/1995 Stone et al. ................ 345/804
5,894,166 A * 4/1999 Surridge ..................... 257/675
6,604,231 B2 * 8/2003 Kaneko ........................ 716/16

FOREIGN PATENT DOCUMENTS

| JP | 04-236668 | | 8/1992 | |
| JP | 04-346239 | | 12/1992 | |
| JP | 05036750 A | * | 2/1993 | ........... H01L/21/60 |
| JP | 05-067679 | | 3/1993 | |
| JP | 05-233760 | | 9/1993 | |
| JP | 11074363 A | * | 3/1999 | ........... H01L/21/60 |

* cited by examiner

Primary Examiner—A. M. Thompson
Assistant Examiner—Sun James Lin
(74) Attorney, Agent, or Firm—McDermott Will & Emery LLP

(57) ABSTRACT

A design support apparatus, when designing multichip packages, verifies connections between a semiconductor chip and leads of a lead frame. Distances between two wires or distances between the wires and the other components are calculated using three-dimensional drawing data (CAD data) and semiconductor package data. Components of the semiconductor packages such as wires, lead frames, or die pads are drawn in the three-dimensional drawing data. The semiconductor package data describes specifications of the semiconductor packages such as outer sizes of the packages. Distance values are compared with design rule data. The design rule data defines constraints on the positional relationship between each wire and each component. The design support apparatus determines whether the acquired positional relationship is proper on the basis of design rule data.

20 Claims, 4 Drawing Sheets

Fig. 7

| ○or× | B/P名 | Pin No. | ○or× | Rule 1 value | ○or× | Rule 2 value | ○or× | ... | ... | ... | Rule N value | ○or× |
|---|---|---|---|---|---|---|---|---|---|---|---|---|
| × | BP 1 | 1 | ○ | 0.2949 | ○ | 0.0635 | ○ | ----- | ----- | ----- | 46.7355 | ○ |
| wire 1 | BP 2 | 2 | × | 0.1061 | ○ | 0.0006 | ○ | ----- | ----- | ----- | 85.3750 | × |
| wire 2 | BP 3 | 3 | ○ | 0.0557 | × | 0.0036 | ○ | ----- | ----- | ----- | 11.2327 | ○ |
| wire 3 | BP 4 | 4 | × | 0.7612 | ○ | 0.0536 | ○ | ----- | ----- | ----- | 70.0674 | ○ |
| wire 4 | BP 5 | 5 | ○ | 0.2541 | ○ | 0.0076 | ○ | ----- | ----- | ----- | 4.4772 | ○ |
| wire 5 | BP 6 | 6 | ○ | 0.5998 | ○ | 0.0726 | ○ | ----- | ----- | ----- | 76.0875 | × |
| wire 6 | BP 7 | 7 | × | 0.9226 | × | 0.0002 | ○ | ----- | ----- | ----- | 58.9397 | ○ |
| wire 7 | | | | | | | | | | | | |
| wire xxx | BP m | n | ○ | 0.4027 | ○ | 0.0092 | ○ | | | | 57.3343 | ○ |

41  42  43  44  46  45  47

DESIGN SUPPORT APPARATUS AND METHOD FOR DESIGNING SEMICONDUCTOR PACKAGES

BACKGROUND OF THE INVENTION

1. Field of the Invention

The present invention relates to a support apparatus for designing semiconductor packages, in particular, for designing wires that connect semiconductor chips to a lead frame.

2. Background Art

Japanese Patent Laid-open No. Hei 5-233760 discloses a layout editing apparatus that is used for designing a layout of semiconductor package. This apparatus determines connections between a semiconductor chip and a lead frame automatically, checks the connection in accordance with wiring rules, and outputs a drawing of layout for the semiconductor package if the connection is appropriate.

Japanese Patent Laid-open Nos. Hei 5-67679, Hei 4-346239, and Hei 4-236668 disclose designing systems that determine the wire connection between a chip and leads while repeating verifications.

In recent years, as semiconductor packages have become denser, multichip packages wherein multiple semiconductor chips are contained in one package are being developed. In the multichip packages, wire-bonding technology is utilized not only for connections between the chips and a lead frame, but also for connections between the chips.

As apparent from the specifications and drawings of the above documents, the systems described above do not accommodate the design of the multichip packages since they determine and check the connections on the basis of two-dimensional design drawings. Therefore, when designing the multichip packages, it may be necessary to check the connections visually as required. However, this visual check may be burdensome for designers since in the multichip packages more wires are disposed in narrower regions than in the conventional packages.

SUMMARY OF THE INVENTION

An object of the present invention is to provide a support apparatus for designing multichip packages that assists designers to check wires connecting semiconductor chips to a lead frame.

The apparatus comprises verifying means to verify whether designed wires satisfy required conditions, on the basis of three-dimensional drawing data, rule data, and component data. The three-dimensional drawing data represents structure of the semiconductor device. The rule data defines the required conditions. The component data represents specifications of components of the semiconductor device.

The three-dimensional drawing data preferably represents a plurality of semiconductor chips to be mounted on the semiconductor devices; lead frames; and wires that connect the semiconductor chips to the lead frames as the components of the semiconductor devices.

The rule data preferably defines conditions of a positional relationship between each wire and each component that compose the semiconductor devices. The conditions determine, for example, the lower limit of a minimum distance between each wire and each component.

Each wire may be defined by three-dimensional coordinates of a point where the wire is connected to the semiconductor chip; three-dimensional coordinates of a point where the wire is connected to the lead frame; and geometry of loop of the wire. The geometry of the wire loop may be defined by a type of the wire loop and three-dimensional coordinates of characteristics by which the geometry of the wire loop is characterized.

The three-dimensional drawing data may include attribute data for identifying the components of the semiconductor devices. Then the verifying means may identify each component of the semiconductor devices on the basis of the attribute data.

The support apparatus may comprise a database for managing the three-dimensional drawing data, the rule data and the component data. In this case, the verifying means acquires each of the data from the database. In this case, the database may manage a plurality of selectable rule data. The verifying means uses one of the rule data indicated by input selection indicating information.

Other and further objects, features and advantages of the invention will appear more fully from the following description.

BRIEF DESCRIPTION OF THE DRAWINGS

The present invention will be more apparent from the following detailed description, when taken in conjunction with the accompanying drawings, in which;

FIG. 7 shows an example of a report of the check results.

DETAILED DESCRIPTION OF THE PREFERRED EMBODIMENTS

A preferred embodiment of the present invention will be described hereinafter with reference to the drawings.

Figure 2B:
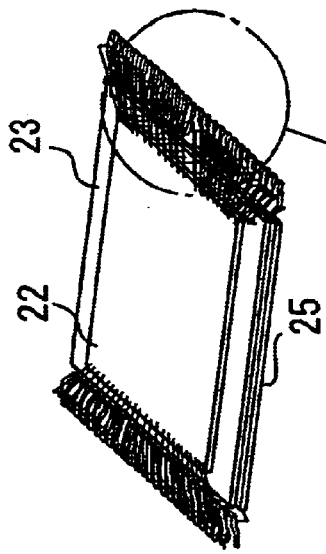
FIGS. 2A, 2B, 2C and 2D, show an internal structure of a semiconductor package.
Figure 2D:
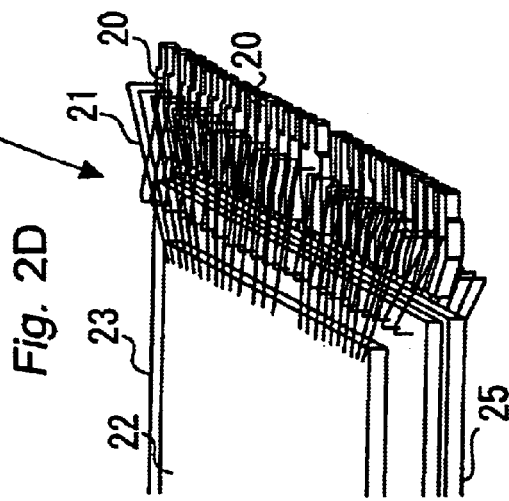
Figure 2A:
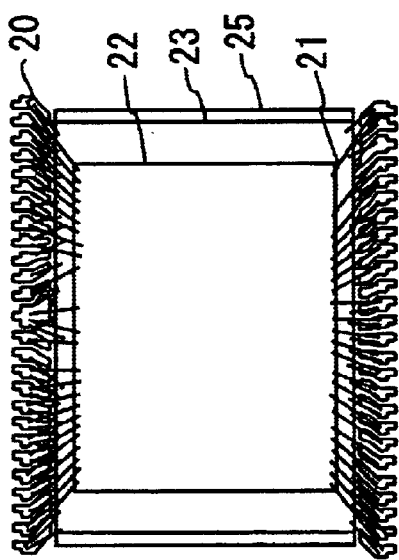
Figure 2C:
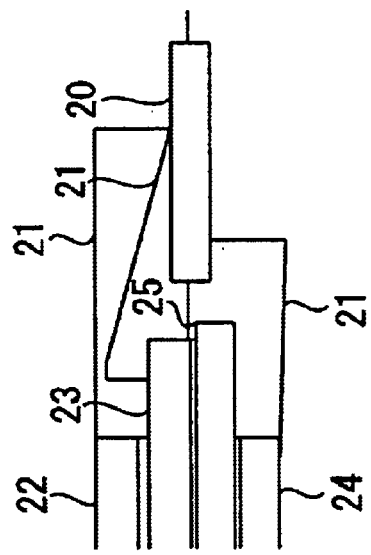

FIGS. 2A, 2B, 2C and 2D, show an internal structure of a semiconductor package that comprises a lead frame. FIG. 2A is a top view, FIG. 2B is a perspective view, FIG. 2C is an enlarged side view, and FIG. 2D is a partially enlarged view of the perspective view of FIG. 2B. As shown in FIGS. 2A and 2B, the internal structure of the semiconductor package is configured such that semiconductor chips 23, 22 are mounted on a die pad 25 and each of the semiconductor chips is connected to leads 20 of a lead frame by wires 21. As shown in FIG. 2C, a semiconductor chip 24 is also mounted on the other side (underside) of the die pad 25, and, as shown in FIGS. 2C and 2D, the semiconductor chip 24 is also connected to the leads 20 of the lead frame by wires 21.

Figure 3:
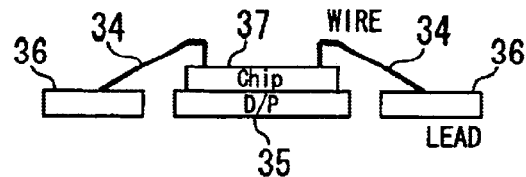
FIGS. 3, 4A, 4B, 5A, 5B, and 6 are simplified side views of semiconductor packages.

FIGS. 3, 4A, 4B, 5A, 5B, and 6 are simplified side views of semiconductor packages. FIG. 3 shows a one-chip type semiconductor package in which only one chip is mounted. Here, a chip 37 is mounted on a die pad (D/P) 35 and the chip 37 is connected to leads 36 by wires 34.

Figure 4A:
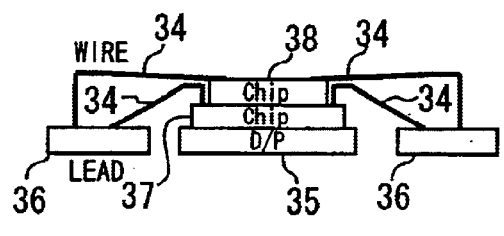
Figure 4B:
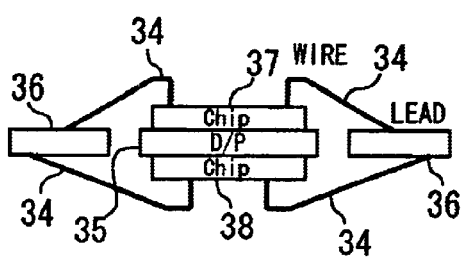

On the other hand, FIGS. 4A and 4B each show a two-chip type semiconductor package wherein two chips are mounted on one die pad. In a semiconductor package of a type shown in FIG. 4A, both two chips 37, 38 are mounted on one side of a die pad 35 and connected to leads 36 by wires 34. On the other hand, in a semiconductor package of a type shown in FIG. 4B, a chip is mounted on each side of the die pad 35 and the two chips are connected to each side of leads 36 by wires 34.

Figure 5A:
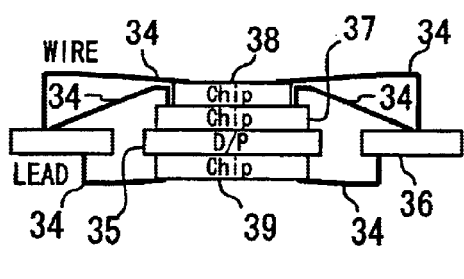
Figure 5B:
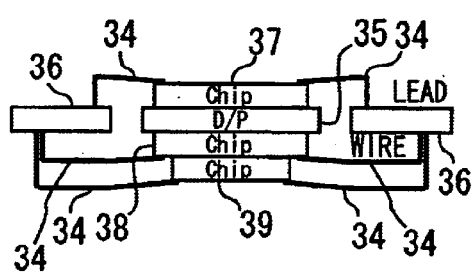

FIGS. 5A and 5B each show a three-chip type semiconductor package wherein three chips are mounted on one die pad. FIG. 5A shows a semiconductor package of a type in which two chips 37, 38 are mounted on one side of a die pad 35 and one chip 39 is mounted on the other side of the die pad 35, while FIG. 5B shows a semiconductor package of a type in which one chip 37 is mounted on one side of a die pad 35 and two chips 38, 39 are mounted on the other side of the die pad 35. Each of the chips 37, 38 and 39 is connected to leads 36 by wires 34.

Figure 6:
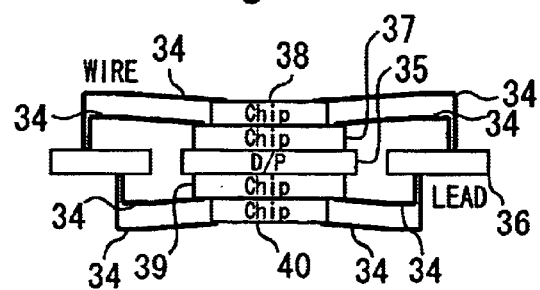

FIG. 6 shows a four-chip type semiconductor package wherein four chips are mounted on one die pad. Here, two chips are respectively mounted on each side of a die pad 35. The chips 37 to 40 are each connected to leads 36 by wires 34. Besides, in some semiconductor packages a plurality of the chips may be placed all in the same plane on a die pad. In addition, a semiconductor package of a type having five or more chips may be adopted.

The apparatus and system set forth in the above Japanese Patent Laid-open No. Hei 5-233760 and so on are predicated on the package as shown in FIG. 3. Therefore, they perform checking of the wiring on the basis of the top view of the package. As can be understood from FIGS. 4A, 4B, 5A, 5B and 6, in the multichip package configuration, since two or more wires may be placed in a direction perpendicular to the die pad 35 (in a longitudinal direction in the drawings), checking according to three-dimensional design rules is required. More specifically, it must be checked whether distances and angles between the two wires 34 are proper or not. Distances and angles between the wires 34 and the semiconductor chips, between the wires 34 and the die pad 35, and between the wires 34 and the leads 36 must also be checked. Thus, it must be verified whether there is any electrical short circuit caused by the contact of the two wires 34, or by the contact of the wires 21 with any chip other than ones which have to be connected properly.

Figure 1:
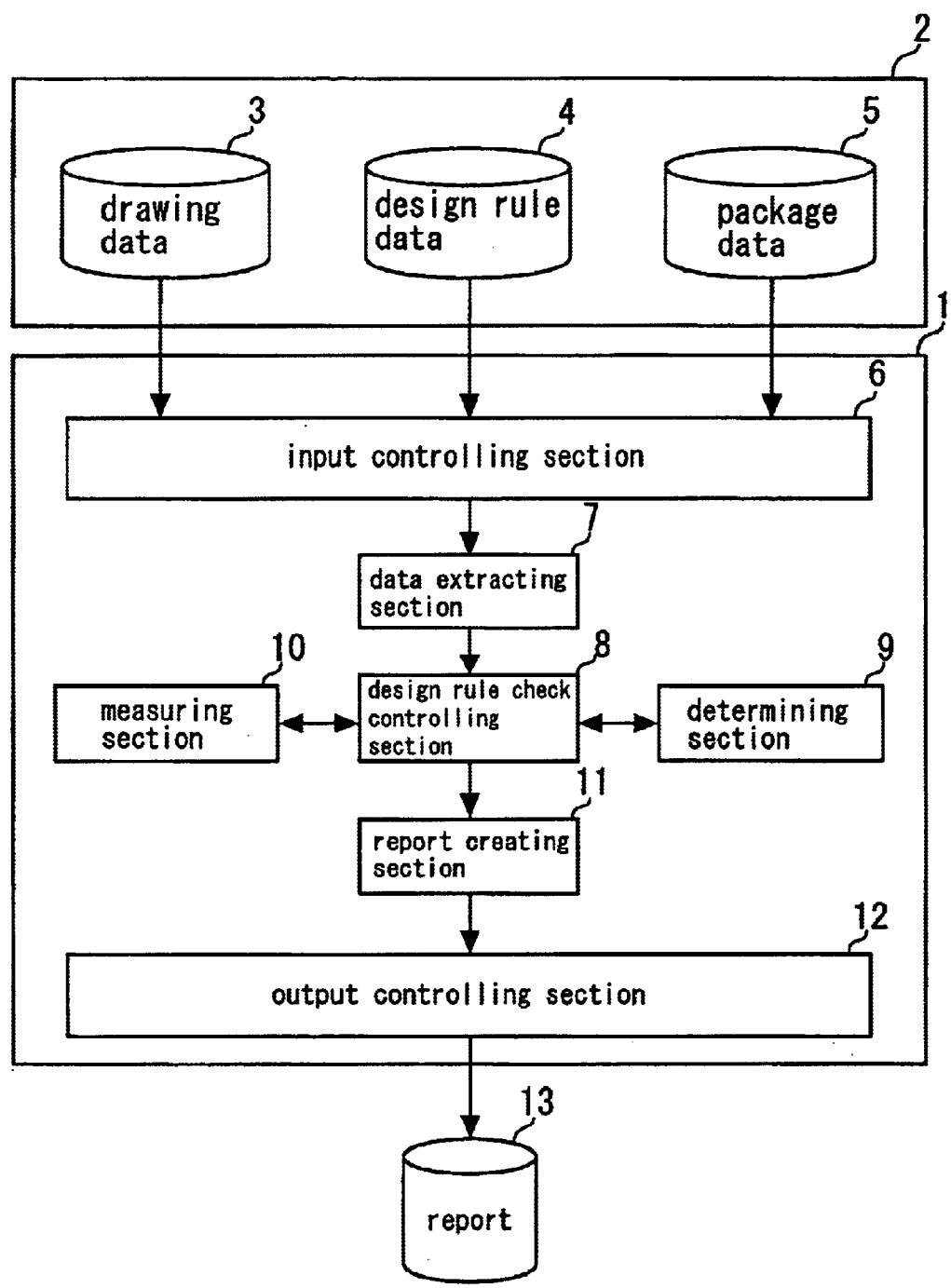
FIG. 1 shows a system including a support apparatus according to one embodiment of the present invention.

FIG. 1 shows a check system including a support apparatus according to one embodiment of the present invention. The system comprises a rule check apparatus 1 as the support apparatus of the present invention, and a database 2 that provides the rule check apparatus 1 with various data.

First, the database 2 and the data managed by the database will be described. The database 2 manages drawing data 3, design rule data 4 and semiconductor package data 5.

The drawing data 3 is three-dimensional CAD data in which components of the semiconductor packages such as wires, lead frames, copper patterns, semiconductor chips, die pads, geometry of packages, die bonding materials, and wire bonding pads are drawn. In this embodiment, it is to be noted that attribute data for identifying each of the components is added to the CAD data so that the rule check apparatus 1 can identify each of the components separately.

The design rule data 4 describes constraints on the wire bonding process. More specifically, it defines constraints on the positional relationship between the wires and each of the components, such as between two wires, between the wires and the semiconductor chips, between the wires and the die pad, between the wires and the leads, between the wires and the package outer surface, between the wire and trade mark, and, between the wires and board wirings. For example, it describes the lower limit of the minimum distance between two wires, namely, the distance where the two wires approach closest to each other.

The semiconductor package data 5 describes specifications of the semiconductor packages such as outer sizes (length, width and height) of the packages, the number of pins, the number of chips, the thickness of chips, the thickness of die bonding materials, and the diameter of wires.

It is possible to obtain distances between the wires or distances between the wires and the other components through calculations based on the configurations drawn in the drawing data 3 and the numerical values shown in the semiconductor package data 5. Further, it is possible to perform verification by comparing the obtained values with the constraints described in the design rule data 4.

Every wire is bonded at its one end to an electrode pad (a wire bonding pad) of a chip and at its other end to a specific position (a stitch) of a lead frame. On the other hand, as understood from a comparison between FIG. 4B and FIG. 5B, wire loops (routes that the wires follow from the chips to the leads) may have various configurations in that, for example, the wire may be bent at a right angle at one position along the wire, or may be bent at several positions in a steplike manner. Therefore, when the wires are designed, each wire is typically defined by position coordinates at which the wire is bonded and the wire loop configuration. Here, the wire loop configuration may be defined, for example, by its geometry type and coordinates of its bending points. The geometry type may be classified by the magnitude of the bending angles into, for example, the geometry shown in FIG. 5B that may be referred to as right angle geometry and the geometry shown in FIG. 4B that may be referred to as acute angle geometry. Alternatively, the geometry type may be classified by the number of bending points into a one-bending point type, two-bending point type, three-bending point type, and so on. Designers can design the wires by specifying bonding coordinates at the chip side $(X_C, Y_C, Z_C)$, bonding coordinates at the lead side $(X_L, Y_L, Z_L)$, the geometry type of the wires, and coordinates of the bending points $(X_{B1}, Y_{B1}, Z_{B1})$, $(X_{B2}, Y_{B2}, Z_{B2})$. Incidentally, the number of the bending points depends on the geometry type of the wires. If the wires are configured in a curved manner, the wire loop configuration may be defined by the radius of curve of the wire and the like instead of the bending angles. In short, the wire loop configuration may be defined by the geometry type and the three-dimensional coordinates of predetermined characteristics.

In the next place, the operation of the rule check apparatus 1 to check whether the wiring is designed properly will be described. The rule check apparatus 1 comprises an input controlling section 6 that controls various data input from the database 2, a data extracting section 7 that extracts data to be checked (the wire bonding pad coordinates, the stitch coordinates, the wire loop configuration, and so on) from the input data, a design rule check controlling section 8 that compares the extracted data with the design rule to check whether the wiring are designed properly, a measuring section 10, a determining section 9, a report creating section 11 that creates a report of the check results, and a output controlling section 12 that outputs created reports.

The design rule check controlling section 8 sends the data extracted by the data extracting section 7 to the measuring section 10. The measuring section 10 measures the two-dimensional distances, three-dimensional distances and angles between the wires and each of the components, such as distances between two wires, between the wires and the semiconductor chips, between the wires and the die pad, between the wires and the leads, between the wires and the package outer surface, between the wires and the trade mark, and, between the wires and the copper patterns, by using the data received from the design rule check controlling section

8. More specifically, the measuring section 10 calculates values such as the minimum distance between wires on the basis of the wire bonding pad coordinates ($X_C$, $Y_C$, $Z_C$), the stitch coordinates ($X_L$, $Y_L$, $Z_L$), the geometry type and the coordinates of the bending points of the wires ($X_{B1}$, $Y_{B1}$, $Z_{B1}$), ($X_{B2}$, $Y_{B2}$, $Z_{B2}$), and the specifications of each component specified by the semiconductor package data 5.

The measuring results are sent back to the design rule check controlling section 8. The design rule check controlling section sends the measuring results received from the measuring section 10 and the design rule data 4 acquired by the input controlling section 6 to the determining section 9. Here, it is to be noted that the design rule check controlling section 8 may also comprise a feature that accepts instructions from the outside to alter the design rule (not shown). For example, if a plurality of design rules are managed by the database 2, when the alteration of the design rule or some values of the design rule is instructed by the operator, another design rule is read from the input controlling section 6 and sent to the determining section 9. The determining section 9 determines whether the measuring results satisfy the design rule and sends back the determination results to the design rule check controlling section 8. The design rule check controlling section 8 sends the determination results to the report creating section 11 and the report creating section 11 creates the report by compiling the determination results. The created report is output through the output controlling section 12 and stored in any storage medium or external storage device as the report 13 in the form of an electronic file.

An example of the report is shown in FIG. 7. In this report, wire names 40 are shown in the third and further rows of the leftmost column. In addition, the second and third columns from the left list the names of wire bonding pads 42 and pin numbers 43 corresponding to the wire names, respectively.

On the other hand, in the fifth and further columns from the left in the highest row, rules that is used in checking process are laterally listed by the number selected by the design rule check controlling section 8. The fifth and further columns of each row list measured values 46 to be checked and determination results 47 indicating whether the measures values satisfy the respective rules. Further, the fourth column from the left of the report shows determination results 44 indicating whether each of the wires satisfies the design rules. Each determination result 44 is marked with symbol O if each of the wires matches all rules 45, consisting of rule 1 to N, or it is marked with symbol X if the wire does not match any of the selected rules. Still further, a determination result for the overall semiconductor package is indicated as an overall determination 41 in the upper-left position of the report. If the determination results 44 for all the wires are labeled as symbol O, then the overall determination 41 will also be symbol O, or if any of the determination results 44 is labeled as symbol X, the overall determination 41 will be symbol X. Here, though the determination results are indicated by symbol O and symbol X, it goes without saying that the determination results may be indicated in a multi-step manner or in a stepless manner using numerical values.

Though the drawing data and the design rules are managed as the database and the rule check apparatus performs verification by reading each data from the database in the embodiment described above, it also goes without saying that the rule check apparatus in itself may alternatively manage each data.

Hereinabove, though the support apparatus for designing wires of a semiconductor device has been described, it is to be noted that this apparatus may be implemented not only as a special-purpose machine but also as a general-purpose computer into which a support program is incorporated. Also, a process of such program may be understood as a method. Therefore, the present specification discloses not only the support apparatus as described above, but also an invention of design method and design support program as follows.

Thus, this specification discloses a method for designing wires of a semiconductor device. The method comprises two steps. First step is designing wires connecting a semiconductor chip to a lead frame in the semiconductor device. Second step is verifying whether designed wires satisfy required conditions, on the basis of three-dimensional drawing data representing structure of the semiconductor device; rule data defining the required conditions, and component data representing specifications of components of the semiconductor device.

Further, the present invention discloses a support program for designing wires of a semiconductor device, the wire connecting a semiconductor chip to a lead frame in the semiconductor device. The program causes a computer to execute the step of verifying whether designed wires satisfy required conditions, on the basis of three-dimensional drawing data representing structure of the semiconductor device; rule data defining the required conditions, and component data representing specifications of components of the semiconductor device.

Such design support program for designing the semiconductor devices may be recorded and distributed on computer-readable media such as a CD-ROM, a DVD, and the like.

The design supporting apparatus for semiconductor devices according to the present invention manages each component that composes a semiconductor package as three-dimensional CAD data, acquires the three-dimensional positional relationship between the components and verifies it against a design rule. Therefore, even if multichip packages in which a plurality of chips is mounted are designed, it is possible to readily ascertain whether there may be any short circuit between the wires or there may occur other malfunctions. This not only lightens the burden on designers, but also reduces malfunction to improve the quality of products.

It is further understood that the foregoing description is a preferred embodiment of the disclosed apparatus and that various changes and modifications may be made in the invention without departing from the spirit and scope thereof.

The entire disclosure of a Japanese Patent Application No. 2002-102231, filed on Apr. 4, 2002 including specification, claims drawings and summary, on which the Convention priority of the present application is based, are incorporated herein by reference in its entirety.

What is claimed is:

1. A support apparatus for designing wires of a semiconductor device, the wires connecting a semiconductor chip to a lead frame in the semiconductor device, comprising:

verifying means to verify whether designed wires satisfy required conditions, based on three-dimensional drawing data representing structure of the semiconductor device, rule data defining the required conditions, and component data representing specifications of components of the semiconductor device.

2. The support apparatus according to claim 1, wherein the three-dimensional drawing data represents:
   a plurality of semiconductor chips to be mounted on the semiconductor device;
   lead frames; and
   wires that connect the semiconductor chips to the lead frames as the components of the semiconductor device.

3. The support apparatus according to claim 1, wherein the rule data defines conditions of a positional relationship between each wire and each component that compose the semiconductor device.

4. The support apparatus according to claim 3, wherein the conditions determine the lower limit of a minimum distance between each wire and each component.

5. The support apparatus according to claim 1, wherein each wire is defined by:
   three-dimensional coordinates of a point where the wire is connected to the semiconductor chip;
   three-dimensional coordinates of a point where the wire is connected to the lead frame; and
   geometry of loop of the wire.

6. The support apparatus according to claim 5, wherein the geometry of the wire loop is defined by:
   a type of the wire loop; and
   three-dimensional coordinates of characteristics by which the geometry of the wire loop is characterized.

7. The support apparatus according to claim 1, wherein the three-dimensional drawing data includes attribute data for identifying the components of the semiconductor device.

8. The support apparatus according to claim 7, wherein the verifying means identifies each component of the semiconductor device on the basis of the attribute data.

9. The support apparatus according to claim 1, further comprising a database for managing the three-dimensional drawing data, the rule data and the component data, wherein the verifying means acquires each of the data from the database.

10. The support apparatus according to claim 9, wherein the database manages a plurality of selectable rule data, and wherein the verifying means uses one of the rule data indicated by input selection indicating information.

11. The support apparatus of claim 1, wherein the three-dimensional drawing data includes wire connections in three-dimensional representations.

12. The support apparatus of claim 1, wherein the verifying means is configured to verify whether the designed wires satisfy the required conditions in a three-dimensional manner.

13. A method for designing wires of a semiconductor device, wherein the wires connect a semiconductor chip to a lead frame in the semiconductor device, the method comprising the machine-implemented steps of:
   accessing three-dimensional drawing data representing structure of the semiconductor device;
   accessing rule data defining required conditions;
   accessing component data representing specifications of components of the semiconductor device; and
   verifying whether designed wires satisfy the required conditions based on the three-dimensional drawing data, the rule data defining the required conditions, and the component data.

14. The method of claim 13, wherein the three-dimensional drawing data includes wire connections in three-dimensional representations.

15. The method of claim 13, wherein the verifying step verifies whether the designed wires satisfy the required conditions in a three-dimensional manner.

16. The method of claim 13, wherein the three-dimensional drawing data represents:
   a plurality of semiconductor chips to be mounted on the semiconductor device;
   lead frames; and
   wires that connect the semiconductor chips to the lead frames as the components of the semiconductor device.

17. The method of claim 13, wherein the rule data defines conditions of a positional relationship between each wire and each component that compose the semiconductor device.

18. The method to claim 17, wherein the conditions determine the lower limit of a minimum distance between each wire and each component.

19. The method of claim 13, wherein each wire is defined by:
   three-dimensional coordinates of a point where the wire is connected to the semiconductor chip;
   three-dimensional coordinates of a point where the wire is connected to the lead frame; and
   geometry of loop of the wire.

20. The method of claim 19, wherein the geometry of the wire loop is defined by:
   a type of the wire loop; and
   three-dimensional coordinates of characteristics by which the geometry of the wire loop is characterized.

* * * * *